US009282660B2

(12) United States Patent
Bailey et al.

(10) Patent No.: US 9,282,660 B2
(45) Date of Patent: Mar. 8, 2016

(54) MODULAR DATA CENTER CABINET RACK

(71) Applicant: Dell Products, LP, Round Rock, TX (US)

(72) Inventors: Mark M. Bailey, Round Rock, TX (US); Anthony P. Middleton, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 247 days.

(21) Appl. No.: 14/029,047

(22) Filed: Sep. 17, 2013

(65) Prior Publication Data

US 2015/0076976 A1    Mar. 19, 2015

(51) Int. Cl.
*H05K 7/20* (2006.01)
*H05K 5/02* (2006.01)
*H05K 7/14* (2006.01)

(52) U.S. Cl.
CPC .............. *H05K 5/0247* (2013.01); *H05K 5/023* (2013.01); *H05K 5/0217* (2013.01); *H05K 7/1491* (2013.01)

(58) Field of Classification Search
CPC . H05K 5/0217; H05K 5/0226; H05K 5/0234; H05K 5/0247
USPC .......................................................... 361/724
See application file for complete search history.

(56) References Cited

U.S. PATENT DOCUMENTS

| 6,425,488 | B1 * | 7/2002 | Notohardjono et al. ......... 211/26 |
| 6,489,565 | B1 * | 12/2002 | Krietzman et al. ........... 174/101 |
| 6,636,418 | B1 * | 10/2003 | Claprood et al. ............. 361/600 |
| 7,087,840 | B2 * | 8/2006 | Herring et al. ................ 174/101 |
| 7,112,131 | B2 * | 9/2006 | Rasmussen et al. ........... 454/184 |
| 8,143,521 | B2 * | 3/2012 | Burek et al. ................... 174/100 |
| 8,400,765 | B2 * | 3/2013 | Ross ........................ 361/679.33 |
| 8,411,465 | B2 * | 4/2013 | Dean et al. ..................... 361/826 |
| 8,925,739 | B2 * | 1/2015 | Crippen et al. .................. 211/26 |
| 2004/0057216 | A1 * | 3/2004 | Smith et al. .................... 361/724 |
| 2005/0068716 | A1 * | 3/2005 | Pereira .......................... 361/624 |
| 2005/0221683 | A1 * | 10/2005 | McGrath et al. .............. 439/701 |
| 2006/0102575 | A1 * | 5/2006 | Mattlin et al. ................ 211/189 |
| 2006/0243690 | A1 * | 11/2006 | Mollard ......................... 211/151 |
| 2008/0037228 | A1 * | 2/2008 | Lewis ............................ 361/724 |
| 2008/0112152 | A1 * | 5/2008 | Figueroa et al. .............. 361/826 |
| 2009/0261211 | A1 * | 10/2009 | Anguiano-Wehde et al. .. 248/56 |
| 2011/0094978 | A1 | 4/2011 | Bailey et al. |
| 2011/0155674 | A1 * | 6/2011 | Knight et al. ................... 211/26 |
| 2012/0062084 | A1 * | 3/2012 | Lewis et al. ................ 312/223.6 |
| 2012/0116590 | A1 | 5/2012 | Florez-Larrahondo et al. |
| 2012/0293932 | A1 | 11/2012 | Jai |
| 2013/0039006 | A1 | 2/2013 | Li et al. |
| 2013/0063894 | A1 | 3/2013 | Wang |
| 2013/0188309 | A1 * | 7/2013 | Ross ........................ 361/679.48 |

* cited by examiner

*Primary Examiner* — Anthony Q Edwards
(74) *Attorney, Agent, or Firm* — Larson Newman, LLP

(57) ABSTRACT

A cabinet rack includes a frame having first and second sides, and first and second power distribution unit brackets. The first power distribution bracket is connected to a first edge of the first side of the frame via a first rotating mount. The second power distribution bracket is connected to a first edge of the second side of the frame via a second rotating mount.

12 Claims, 5 Drawing Sheets

MODULAR DATA CENTER CABINET RACK

FIELD OF THE DISCLOSURE

This disclosure generally relates to information handling systems, and more particularly relates to a modular data center cabinet rack.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

A data center operates a large number of information handling systems to provide storage and processing for a large number of smaller client systems. A modular data center is a portable version of a data center that provides an easily expandable computing capacity that is quick to set up and to get operational, without having the building construction and infrastructure worries typically associated with a traditional data center. A modular data center includes multiple rack cabinets, which can each hold multiple servers or information handling systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
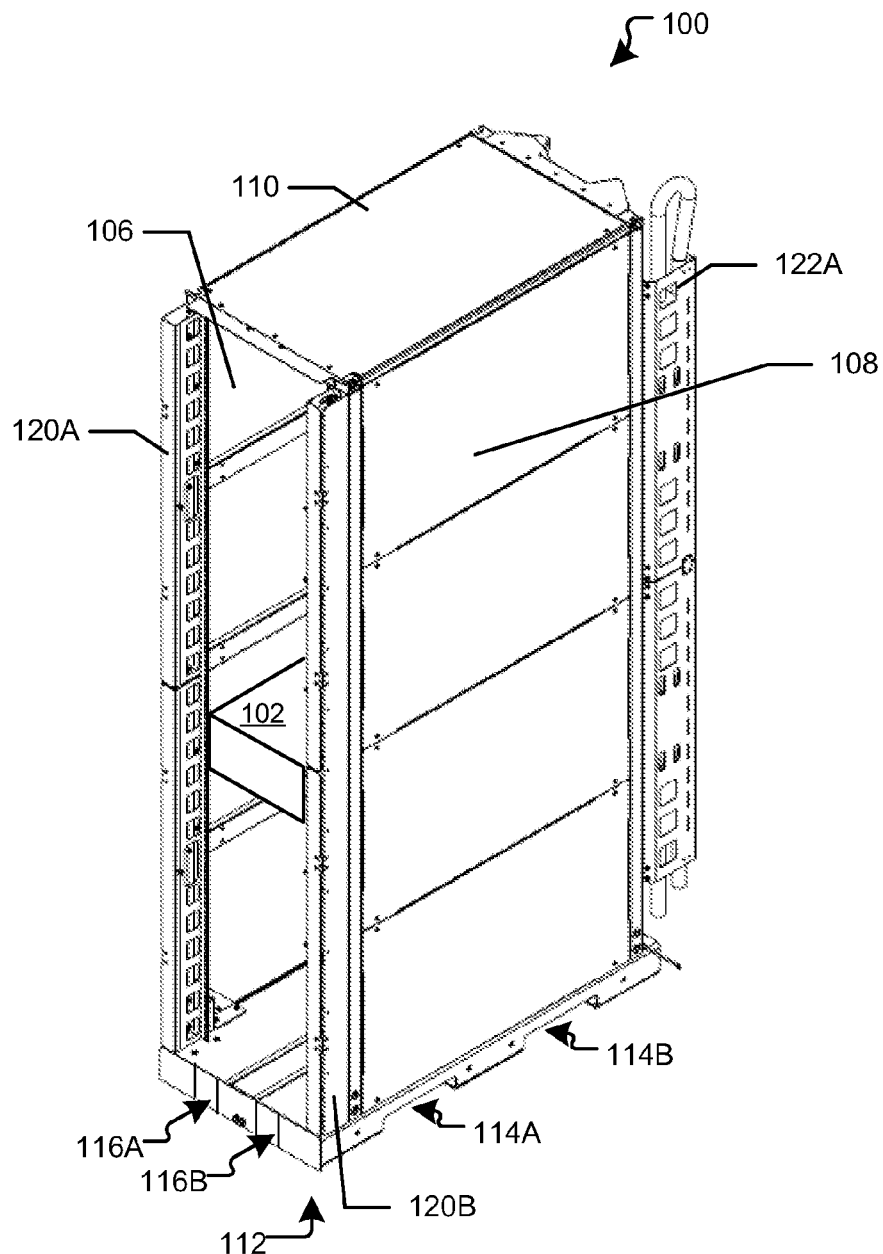
FIGS. 1-3 are diagrams showing different perspective views of a cabinet rack.
Figure 2:
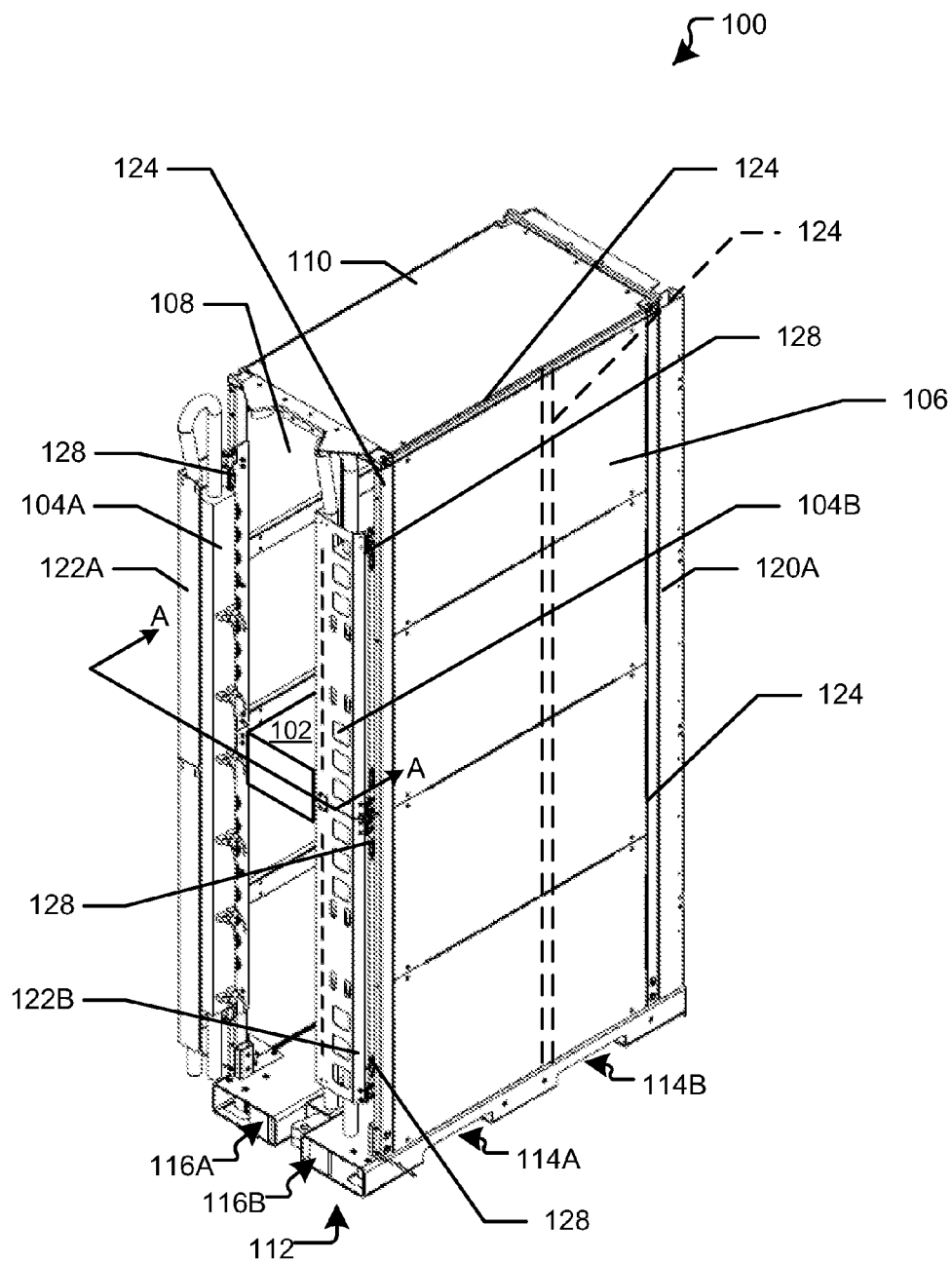
Figure 3:
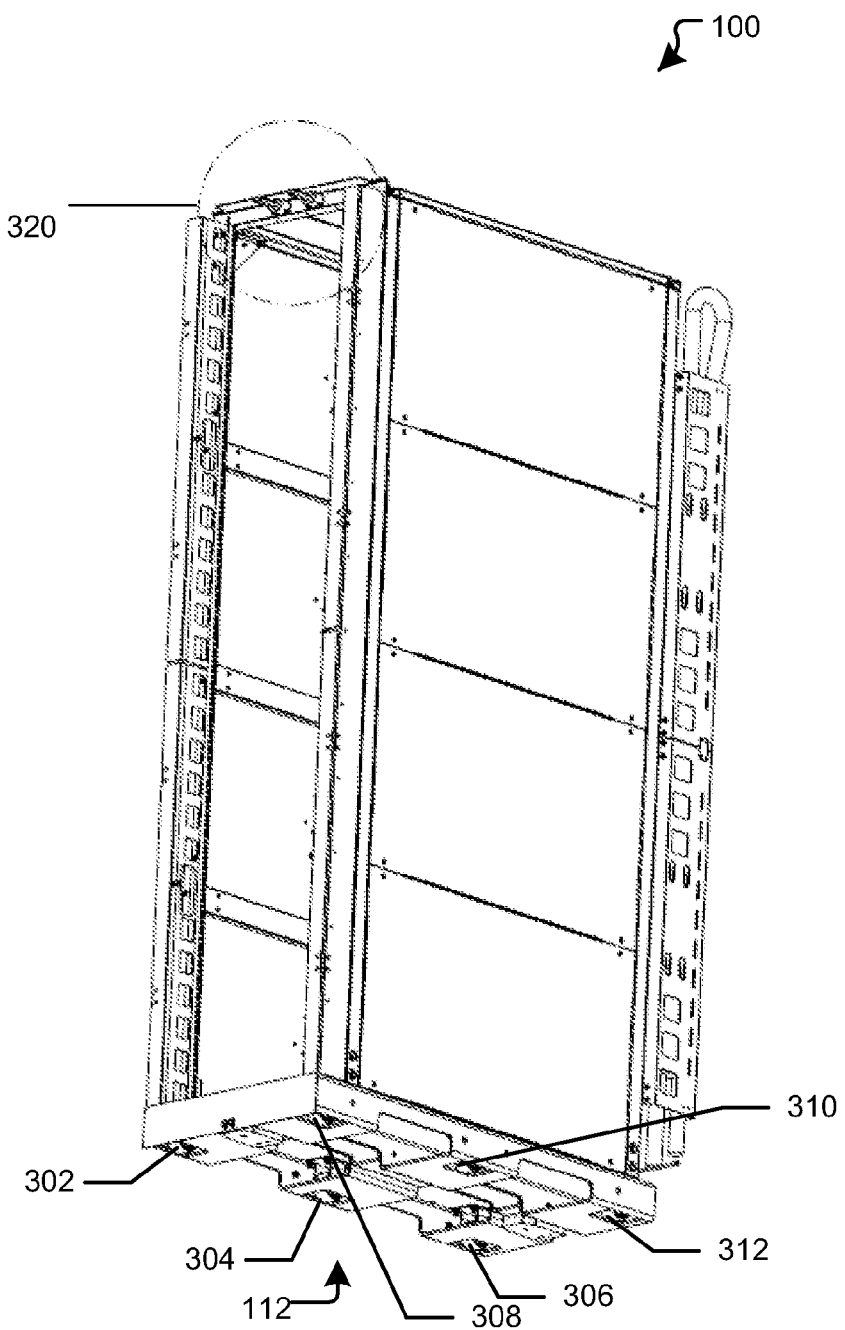

FIGS. 1-3 illustrate a rack cabinet 100 to hold one or more information handling systems, such as server 102, and one or more power distribution units (PDUs) 104A and 104B. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The cabinet rack 100 includes sides 106 and 108, a top 110, and a base 112. The cabinet rack also includes a frame 124 to support the weight of information handling systems, such as server 104, and to provide structural support for sides 106 and 108, and the top 110. The cabinet rack 100 also includes cable management brackets 120A and 120B, and PDU brackets 122A and 122B. The base 112 includes side fork lift pockets 114A and 114B, inline fork lift pockets 116A and 116B, and casters 302, 304, 306, 308, 310, and 312 (302-312). In the embodiment described herein, the cabinet rack 100 can be placed within and integrated into a modular data center along with multiple other cabinet racks. The modular data center can then be transported to a desired location to provide on-site processing/storage capabilities. In other embodiments, the cabinet rack 100 can be utilized in any type server room or other location one or more racks of servers are utilized.

The cabinet rack 100 is designed to hold a large number of information handling systems including server 102, such that the frame 124 and base 112 can thereby support a large amount of weight. For example, the structural design of the frame 124 and the base 112 can support up to five thousand pounds. The possibility that the cabinet rack 100 can weigh upwards of five thousand pounds can make it difficult to move the cabinet rack around on the casters 302-312 if the casters swivel in different directions. For example, the weight of the cabinet rack 100 could bind the casters 302-312, such that the casters cannot swivel. Thus, the casters 302-312 can be uni-directional casters that can make is possible to roll/translate the cabinet rack 100 in a single direction. Therefore, the side fork lift pockets 114A and 114B, and the inline fork lift pockets 116A and 116B can be utilized by a user to move the cabinet rack 100 in multiple directions to get the cabinet rack into and out of a modular data center. For example, while the cabinet rack 100 is outside of the modular data center, the user can insert a fork lift into the inline fork lift pockets 116A and 116B to pick up and move the cabinet rack to the modular data center.

When the cabinet rack 100 is placed within the modular data center, the user can then insert a device, such as a low profile pallet jack, into the side fork lift pockets 114A and 114B. A user can then lift and move the cabinet rack 100 in a direction that is perpendicular to casters within the base 112 and place the cabinet rack in front of a particular rack slot in the modular data center. The user can then remove the pallet jack from the side fork lift pockets 114A and 114B, and can roll the cabinet rack 100 into the rack slot on the casters 302-312. In an embodiment, the modular data center can include alignment components that can slide within a slot of the base 112 to ensure that the cabinet rack 100 is properly aligned and retained within the slot of the modular data center.

While the cabinet rack 100 is inserted within the modular data center, a user may want to monitor the temperature and humidity within the cabinet rack. These measurements can be performed by temperature/humidity sensors being placed through the cabinet rack 100. In an embodiment, these sensors can be mounted on features 128 connected to the inside cable management bracket 120B, and PDU brackets 122A and 122B. For example, the cabinet rack 100 can include four features 128 on cable management bracket 120B and a total of eight features 128 on the PDU brackets 122A and 122B. The features 128 can also be found in additional locations of the cabinet rack 100 and the cabinet rack 100 can also include a different number of features without varying from the scope of this disclosure. The cabinet rack 100 can be designed and sent to the modular data with the features 128 on the cable management brackets 120A and 120B and the PDU brackets 122A and 122B so that a user can mount temperature/humidity sensors within the cabinet rack. The temperature/humidity sensors can then be connected to the server 102, and the PDUs 104A and 104B, or any other information handling system to provide the temperature and humidity information to the user.

As stated above, the cabinet rack 100 can be loaded with different information handling systems, including the server 102 and the PDUs 104A and 104B, prior to the cabinet rack being placed within the modular data center. The servers, PDUs, and other equipment can include multiple communication and power cables that should be routed and held in an organized fashion. The cable management brackets 120A and 120B, and the PDU brackets 122A and 122B can be utilized to efficiently organize and retain the cables for the equipment in the cabinet rack 100. In an embodiment, the cable management brackets 120A and 120B can be integrated into the cabinet rack 100 in a fixed position along the sides 106 and 108, such that the cable management brackets are built and permanently attached to the cabinet rack. For example, the cable management bracket 120A can be vertically mounted on the frame 124 along the front of side 106, and connected to the base 112. Similarly, the cable management bracket 120B can be vertically mounted on the frame 124 along the front of side 108 and connected to the base 112.

The server 102 can have most of or all of its input/output ports in the front so that the communication cables are connected to the front of the server and then routed in the front of the cabinet rack 100 to other information handling systems. The cable management brackets 120A and 120B can be utilized to receive and retain the cables from the server 102 and other information handling systems mounted in the rack cabinet 100. In an embodiment, the cable management brackets 120A and 120B can be sized so that the outside edge of each of the cable management brackets 120A and 120B aligns with the respective outside edge of the sides 106 and 108, and the inside of each of the cable management brackets aligns with a respective inside edge of a support bar 126 within the cabinet rack 100. Thus, the size of the cable management brackets 120A and 120B can be determined based on a thickness of the support members 126. In this embodiment, the sizes of the cable management brackets 120A and 120B are designed so that the server 102 can be inserted into and removed from the cabinet rack 100 without hitting the cable management brackets.

Figure 4:
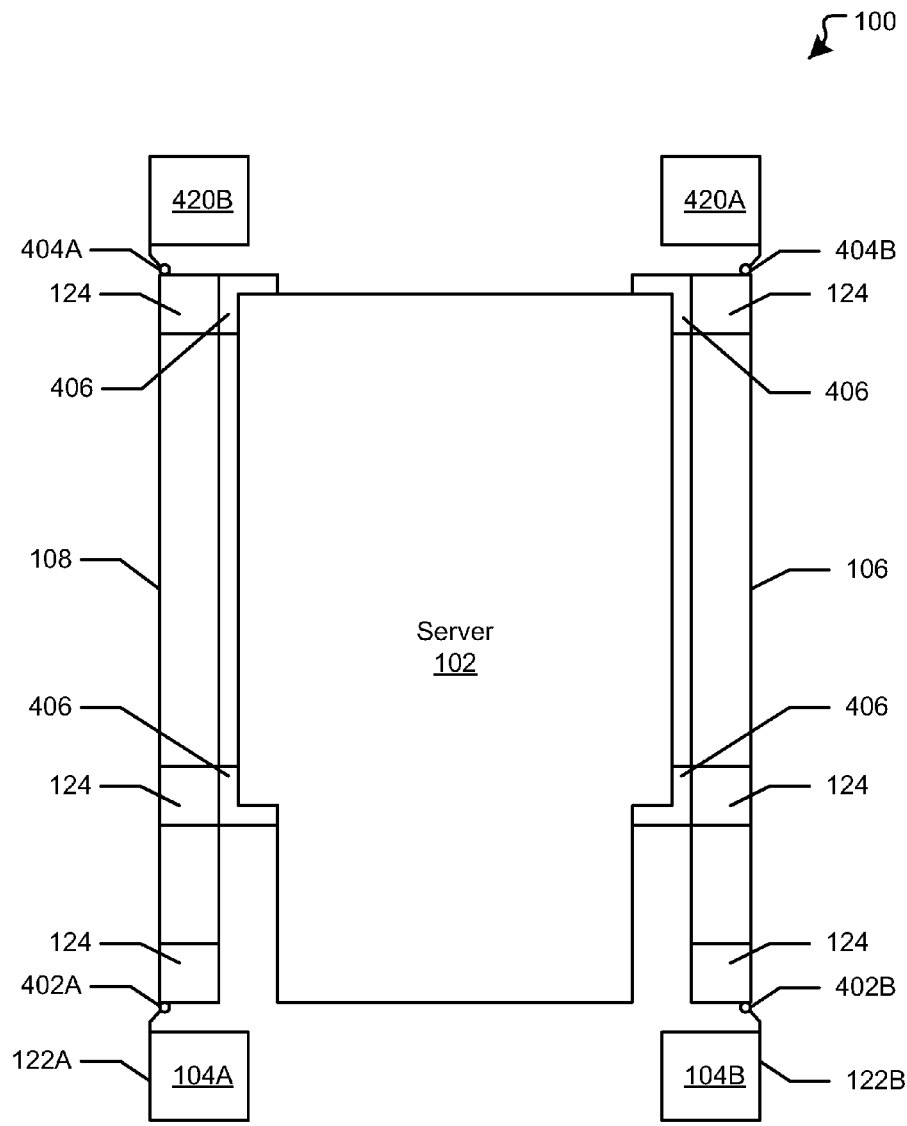
FIG. 4 is a diagram showing a cross section of the cabinet rack taken along line A-A of FIG. 2.

The power cables for the servers, such as server 102, can extend out of the back of the cabinet rack. The PDU brackets 122A and 122B can be utilized to route the power cables between the PDUs 104A and 104B on the PDU brackets 122A and 122B and servers and other information handling systems of the cabinet rack 100. The PDU bracket 122A is preferably connected to the frame 124 at the back edge of the side 108, and PDU bracket 122B is preferably connected to the frame 124 at the back edge of the side 106. Each of the PDU brackets 122A and 122B has a PDU, such as power PDU 104A of PDU bracket 122A. In an embodiment, the PDU bracket 122A and PDU 104A can extend from an outside edge of frame 124 along the side 108 and over lap the back of the server 102, as shown in FIG. 4. Similarly, the PDU bracket 122B and a PDU 104B, shown in FIG. 4, can extend from an outside edge of the frame 124 along the side 106 and over lap the PDU 104. Thus, when the PDU brackets 122A and 122B in a normal operating position, the PDU brackets can prevent the server 102 from being inserted into or removed from the cabinet rack 100. However, the PDU brackets 122A and 122B can be designed to swivel or rotate, such that the PDU brackets can be moved out of the way of the server 102 if the server needs to be inserted into or removed from the cabinet rack 100.

FIG. 4 shows a cross section of the cabinet rack 100 taken along line A-A in FIG. 2. The cross section of the cabinet rack 100 includes mounts 402A, 402B, 404A, and 404B, brackets 406 and 408, cable management brackets 420A and 420B, the server 102, the PDU 104, sides 106 and 108, PDU brackets 122A and 122B, and PDUs 126A and 126B. The server 102 can be mounted to the cabinet rack 100 via the brackets 406. The PDU bracket 122A and PDU 104a is mounted to an edge of the frame 124 along the side 108 via mount 402A. Similarly, the PDU bracket 122B and PDU 104B is mounted to an edge of the frame 124 along the side 106 via mount 402B. In an embodiment, mounts 402A and 402B can be hinges that each extends the length of the respective PDU bracket 122A and 122B. In other embodiments, the mounts 402A and 402B can be any device or component capable on enabling the PDU brackets 122A and 122B to rotate toward and away from the PDU 104.

The cable management brackets 420A and 420B can be similar to the cable management brackets 120A and 120B of FIGS. 1 and 2, such that they can be utilized to route cables from the server 102 to other information handling systems in the cabinet rack 100. However, the cable management brackets 420A and 420B differ from the cable management brackets 120A and 120B in that the cable management brackets 420A and 420B can rotate while the cable management brackets 120A and 120B are mounted in fixed positions. For example, the cable management bracket 420A is mounted to an edge of the frame 124 along the side 106 via mount 404B. Similarly, the cable management bracket 420B is mounted to an edge of the frame 124 along the side 108 via mount 404A. In an embodiment, mounts 404A and 404B can be hinges that each extends the length of the respective cable management brackets 420A and 420B. In other embodiments, the mounts 404A and 404B can be any device or component capable on enabling the cable management brackets 420A and 420B to rotate toward and away from the server 102.

While the PDU brackets 122A and 122B, and the cable management brackets 420A and 420B are in a position for normal operation of the cabinet rack 100, the PDUs 104A and 104B can overlap the back of the server 102, and the cable management brackets can overlap the front of the server. However, as described above the PDU brackets 122A and 122B, and the cable management brackets 420A and 420B can rotated away from the cabinet rack 100 to allow a user to remove the server 102.

Figure 5:
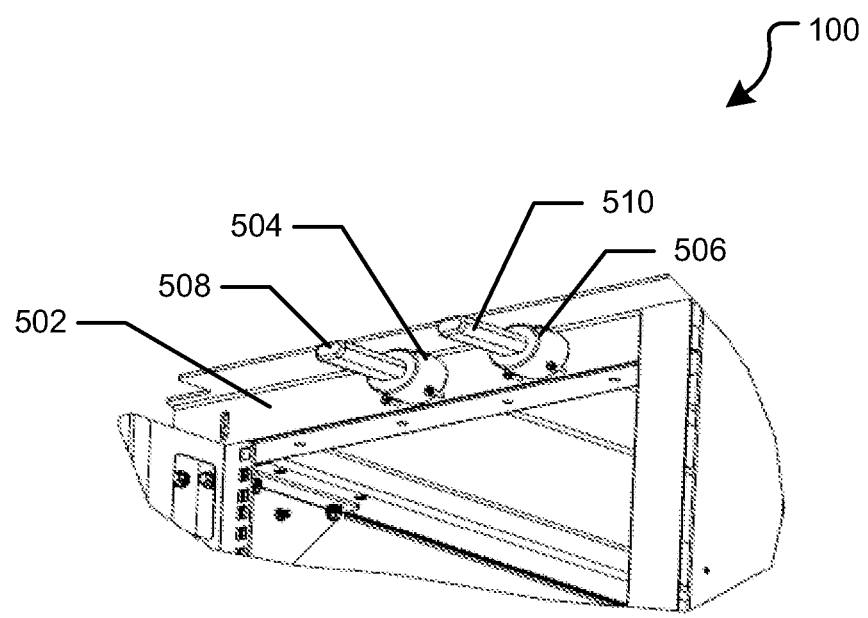
FIG. 5 is a diagram showing an expanded portion of the cabinet rack.

FIG. 5 shows an enlarged view of region 320 of the cabinet rack 100, shown in FIG. 3. The cabinet rack 100 includes a front 502, which in turn includes wireless access point mount features 504 and 506. The wireless access point mount features 504 and 506 can be connected to and in communication with the server 102 of FIGS. 1 and 2, the temperature/humidity sensors connected to the features 128, and other information handling systems in the cabinet rack 100. The wireless access point mount features 504 and 506 can be connected to the sensors via the PDUs 104A and 104B. Thus, when a wireless access point 508 is connected to the wireless access point feature 504 and a wireless access point 510 is connected to the wireless access point feature 506 the wireless access points can communication with the server 102 and the sensors to provide a user with wireless Internet access to the server and the data collected by the sensors.

Although only a few exemplary embodiments have been described in detail in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A cabinet rack comprising:
 a frame including first and second sides;
 first and second power distribution unit brackets, wherein the first power distribution bracket is connected to a first edge of the first side of the frame via a first rotating mount, and the second power distribution bracket is connected to a first edge of the second side of the frame via a second rotating mount; and
 a cable management bracket in physical communication with a second edge of the first side of the frame via a third rotating mount, wherein the first cable management bracket is configured to retain cables extending from within the cabinet rack, wherein the third rotating mount enables the cable management bracket to rotate toward and away from the server.

2. The cabinet rack of claim 1 wherein the first rotating mount enables the first power distribution unit bracket to rotate toward and away from a back of the cabinet rack, and the second rotating mount enables the second power distribution unit bracket to rotate toward and away from the back of the cabinet rack.

3. The cabinet rack of claim 1 further comprises:
 a base in physical communication with the first and second sides, the base including casters to enable the cabinet rack to roll in a first direction.

4. The cabinet rack of claim 3 wherein the base further includes side fork lift pockets, wherein the side fork lift pockets enable a user to move the cabinet rack in a second direction that is perpendicular to the first direction.

5. A cabinet rack comprising:
 a frame including first and second sides;
 a server connected between the first and second sides of the frame;
 first and second power distribution unit brackets, wherein the first power distribution bracket is connected to a first edge of the first side of the frame via a first rotating mount, and the second power distribution bracket is connected to a first edge of the second side of the frame via a second rotating mount; and
 a cable management bracket in physical communication with a second edge of the first side of the frame via a third rotating mount, wherein the first cable management bracket is configured to retain cables extending from the server, wherein the third rotating mount enables the cable management bracket to rotate toward and away from the server.

6. The cabinet rack of claim 5 wherein the first rotating mount enables the first power distribution unit bracket to rotate toward and away from a back of the cabinet rack, and the second rotating mount enables the second power distribution unit bracket to rotate toward and away from the back of the server within the cabinet rack.

7. The cabinet rack of claim 5 further comprises:
 a base in physical communication with the first and second sides, the base including casters to enable the cabinet rack to roll in a first direction.

8. The cabinet rack of claim 7 wherein the base further includes side fork lift pockets, wherein the side fork lift pockets enable a user to move the cabinet rack in a second direction that is perpendicular to the first direction.

9. A cabinet rack comprising:
 a frame including first and second sides;
 a server connected between the first and second sides of the frame;
 a power distribution unit (PDU) bracket, wherein the power distribution bracket is connected to a first edge of the first side of the frame via a first rotating mount;
 a power distribution unit mounted within the PDU bracket, the power distribution unit configured to provide power to the server; and
 a cable management bracket in physical communication with a second edge of the first side of the frame via a second rotating mount, wherein the first cable management bracket is configured to retain cables extending from the server, wherein the second rotating mount enables the cable management bracket to rotate toward and away from the server.

10. The cabinet rack of claim 9 wherein the first rotating mount enables the power distribution unit bracket to rotate toward and away from a back of the server.

11. The cabinet rack of claim 9 further comprises:
 a base in physical communication with the first and second sides, the base including casters to enable the cabinet rack to roll in a first direction.

12. The cabinet rack of claim 11 wherein the base further includes side fork lift pockets, wherein the side fork lift pockets enable a user to move the cabinet rack in a second direction that is perpendicular to the first direction.

* * * * *